United States Patent

Sunahara

[11] Patent Number: 6,094,111
[45] Date of Patent: Jul. 25, 2000

[54] INDUCTANCE-CAPACITANCE COMPOSITE COMPONENT WITH A GLASS HAVING A LOW TEMPERATURE SOFTENING POINT

[75] Inventor: Hirofumi Sunahara, Shiga-ken, Japan

[73] Assignee: Murata Manufacturing Co., Ltd., Japan

[21] Appl. No.: 08/971,505

[22] Filed: Nov. 17, 1997

[30] Foreign Application Priority Data

Nov. 18, 1996 [JP] Japan .................................. 8-306028

[51] Int. Cl.[7] ................................................. H03H 7/01
[52] U.S. Cl. ............................ 333/184; 333/185; 501/32
[58] Field of Search .................... 333/184, 185; 501/32

[56] References Cited

U.S. PATENT DOCUMENTS

| | | | |
|---|---|---|---|
| 4,956,114 | 9/1990 | Watanabe et al. | 501/32 X |
| 5,098,869 | 3/1992 | Morimoto et al. | 501/32 |
| 5,312,674 | 5/1994 | Haertling et al. | 501/32 X |
| 5,397,753 | 3/1995 | Nishiyama et al. | 501/32 X |
| 5,530,411 | 6/1996 | Nakata et al. | 333/185 |
| 5,827,792 | 10/1998 | Fukuda et al. | 501/32 X |

OTHER PUBLICATIONS

Doremus, "Glass Science", 2nd ed., Wiley & Sons, NY, pp. 100, 1994.

Bansal et al., "Handbook of Glass Properties", Academic Press, Harcourt Brace Jovanovich, pp. 231, 1986.

*Primary Examiner*—Justin P. Bettendorf
*Attorney, Agent, or Firm*—Ostronlenk, Faber, Gerb & Soffen, LLP

[57] ABSTRACT

An inductance-capacitance (LC) composite component comprising a body obtained by monolithically sintering a capacitor portion having a layered structure consisting of a dielectric ceramic layer and an electrode layer with an inductor portion having a layered structure consisting of a magnetic ceramic layer and an electrode layer, wherein at least one of said dielectric ceramic layer and said magnetic layer contains a glass having a softening point of 800° C. or lower, and said dielectric ceramic layer and said magnetic layer are monolithically sintered at a temperature of 1,000° C. or lower. The LC composite component is free from generation of cracks and degradation in characteristics, and is thereby highly reliable.

11 Claims, 1 Drawing Sheet

INDUCTANCE-CAPACITANCE COMPOSITE COMPONENT WITH A GLASS HAVING A LOW TEMPERATURE SOFTENING POINT

BACKGROUND OF THE INVENTION

1. Field of the Invention

The present invention relates to a multilayered chip-type inductance-capacitance (LC) composite component, and it particularly relates to an LC composite component obtained by monolithically sintering a capacitor portion and an inductor portion.

2. Description of the Related Art

A multilayered chip-type LC composite component obtained by combining an inductor and a capacitor is used in, for example, a passive filter. The LC composite component comprises, as the main body of the component, a multilayered structure obtained by layering green sheets of a magnetic material and a dielectric material in turn, and by then monolithically sintering the resulting structure. More specifically, magnetic ceramic portions which provide the inductor and dielectric portions which provide the capacitor are superposed in turn, and the resulting structure is monolithically sintered thereafter.

Although there are various types of dielectric ceramic materials, not all can be used directly in the monolithic sintering with a magnetic ceramic material. However, to meet for a wide variety of applications, the use of a still increasing variety of dielectric ceramic materials in LC composite components is strongly requested.

To meet for the demand above while employing the technology for monolithically sintering a dielectric ceramic portion and a magnetic ceramic portion, it is necessary to permanently achieve favorable joint between the different type of materials. This can be accomplished by controlling the sintering behavior and the diffusion species as well as by controlling the stress, which generates at the joint interface on cooling from the sintering temperature to room temperature, to a value not higher than the breaking point of both dielectric and magnetic ceramics. Techniques related to these are disclosed in, for instance, the following literature.

In Unexamined Published Japanese Patent Application No. 64-61015 is disclosed a technique of incorporating a borosilicate glass in the ceramic dielectric layer so as to approximate the linear expansion coefficient of the ceramic dielectric layer to that of the ceramic magnetic layer. The addition of a glass component in this case is aimed to relax the stress which originates from the difference in thermal expansion coefficient of the layers.

In Examined Published Japanese Patent Application No. 8-8201 is disclosed adding a borosilicate glass containing an alkaline earth oxide into the ceramic dielectric material and/or the ceramic magnetic material in order to approximate the linear expansion of one material to that of the other. In this case again, the object of the addition of the glass component is to relax the stress which results from the difference in thermal expansion coefficient.

As described above, the effect that is expected by adding a borosilicate glass into the dielectric ceramic material and/or the magnetic ceramic material is controlling the thermal expansion coefficient of the capacitor portion and the inductor portion by complexing the thermal expansion coefficients of the dielectric ceramic material and the magnetic ceramic material.

To cope with the wide range of thermal expansion coefficient, however, this method of changing the thermal expansion coefficient of the glass alone has difficulties or limits. The thermal expansion coefficient of a borosilicate glass can be changed by changing the composition and the compositional ratio of the glass. However, the change in composition and compositional ratio influences the physical and chemical properties of the borosilicate glass. In particular, the glass viscosity, whose effective index is the softening point of glass, is greatly affected. The change in viscosity also changes the sinterability of the capacitor and the inductor portions. Accordingly, a change in thermal expansion signifies a change in sintering temperature as well, and generates defects such as peeling and warping on the monolithically sintered product component.

Furthermore, the above disclosures describe nothing on the influence of glass on the joining properties between the dielectric ceramic material and magnetic ceramic material into which the glass is added. In fact, by changing the composition and the compositional ratio of glass, and thereby changing the viscosity of the glass, the interdiffusion rate and the reactivity of the components change between the capacitor portion and the inductor portion to affect the joining properties.

Moreover, although depending on the compositional ratio, the borosilicate glass that is contained in the dielectric ceramic layer and the magnetic ceramic layer may undergo degradation in resistances against moisture, acids, and alkalis. The incorporation of $B_2O_3$ is a cause of bringing about such a degradation on the glass. This effect can be observed particularly in the $SiO_2$-poor regions. The loss in reliability on the glass by the incorporation of $B_2O_3$ may lead to a vital defect for LC composite components by inducing, for instance, interlayer migration in the dielectric ceramic layers of the capacitor portion.

SUMMARY OF THE INVENTION

An object of the present invention is, accordingly, to provide an LC composite component which overcomes the aforementioned problems in the art.

The present invention relates to an LC composite component comprising a body obtained by monolithically sintering a capacitor portion having a layered structure consisting of a dielectric ceramic layer and an electrode layer with an inductor portion having a layered structure consisting of a magnetic ceramic layer and an electrode layer, which is characterized by the following constitutions that are employed to overcome the aforementioned technological problems.

More specifically, the present invention is characterized in that at least one of said dielectric ceramic layer and said magnetic layer contains a glass having a softening point of 800° C. or lower, and that said dielectric ceramic layer and said magnetic layer are monolithically sintered at a temperature of 1,000° C. or lower.

In the present invention, preferably, the glass is selected as such that it is contained in at least one of said dielectric ceramic layer and said magnetic layer at a concentration of from 0.5 to 90% by weight.

Preferably, borosilicate glass free of $B_2O_3$ is used.

Furthermore, the glass preferably contains, as the principal components thereof, from 1 to 15% by molar of at least one type of a compound expressed by $Ma_2O$ (where Ma represents an alkali metal); from 20 to 70% by molar of at least one type of a compound expressed by MeO (where Me represents an alkaline earth metal); from 5 to 60% by molar of $SiO_2$; and from 0.5 to 70% by molar of $Bi_2O_3$.

Further, the glass preferably contains, as the secondary components thereof, 50% by molar or less of $TiO_2$ and 50% by molar or less of CuO; or 5% by molar or less of at least one of the group consisting of ZnO, $Co_3O_4$, and NiO; or 5% by molar or less of at least one of $Al_2O_3$ and $ZrO_2$; or 5% by molar or less of at least one of rare earth oxides; or a combination thereof.

DETAILED DESCRIPTION OF THE EMBODIMENTS

Figure 1:
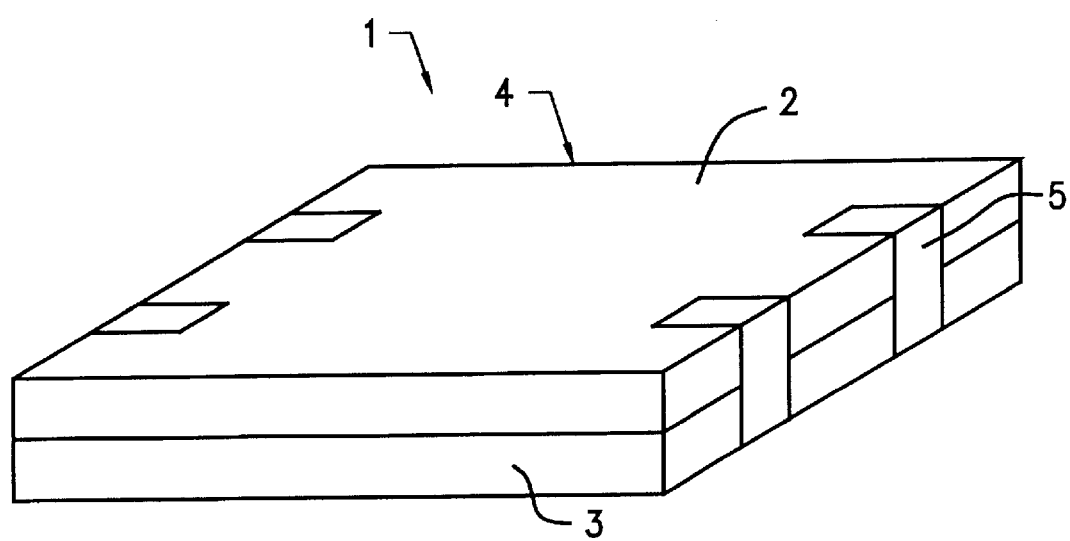
FIG. 1 is a perspective view showing the external appearance of an LC composite component according to an embodiment of the present invention.

The present invention is described in further detail below.

In the perspective view of FIG. 1 is shown the external appearance of an LC composite component 1 according to an embodiment of the present invention. The LC composite component 1 comprises a main body 4 obtained by monolithically sintering a capacitor portion 2 and an inductor portion 3, and a plurality of external electrodes 5 are formed on the end face of the main body 4 of the component. An example of detailed structure of a LC composite component is disclosed in U.S. Pat. No. 5,530,411. The disclosure of the U.S. patent is incorporated herein by reference.

Although the details are not shown in the figure, the capacitor portion 2 is made of a layered structure consisting of dielectric ceramic layers and electrode layers, and the inductor portion 3 is made of a layered structure consisting of magnetic ceramic layers and electrode layers. The dielectric ceramic layers and/or magnetic layers contain a glass component having a softening point of 800° C. or lower, and the capacitor portion 2 is monolithically sintered with the inductor portion 3 at a temperature not higher than 1,000° C.

In the LC composite component having the constitution above, the joint between the capacitor portion 2 and the inductor portion 3 is realized by, as is described above, the interdiffusion of a low softening glass contained mainly in the dielectric ceramic layers and/or magnetic layers.

The use of interdiffusion of low softening glass as a means of forming a joint not only is advantageous in realizing low temperature sintering, but also considerably reduces the stress (residual stress) that forms on the joint interface; that is, because the residual stress in the dielectric ceramic layers and/or magnetic layers containing glass is negligible at temperatures higher than the strain point of glass, the residual stress at lower temperatures can be considerably reduced as compared with the case of a joint formed by solid phase reaction by using a low softening glass in order to adjust the thermal expansion coefficient to be approximately equal. The relation between the sintering temperature and the residual stress is mainly determined by the glass viscosity expressed representatively by the softening point of the glass, and the wettability of each of the dielectric and the magnetic materials to the glass.

On the other hand, a metal having low resistivity and containing, for instance, gold, silver, or copper, as the principal component thereof should be incorporated into the electrode layer of the LC composite component 1. To obtain such an electrode layer, the dielectric ceramic layers and the magnetic layers must be sintered at a temperature of 1,000° C. or lower. The use of a glass having a softening point of 800° C. or lower as the additive to the dielectric ceramic layers and/or the magnetic layers enables the sintering at a temperature of 1,000° C. or lower.

The glass above having a softening point of 800° C. or lower is preferably added at a concentration of from 0.5 to 90% by weight. When an attempt is made to join a square plane about 10 $mm^2$ in area at a temperature of 1,000° C. by solid phase reaction joining, in general, it is known that, although depending on the Young's modulus and the Poisson ratio of the materials to be joined, cracks generate in the joint interface if the difference in thermal expansion coefficient between the joining materials exceeds $0.5 \times 10^{-6}$/° C. In contrast to the above, by adding a glass having a softening point of 800° C. or lower at a concentration of 0.5 to 90% by weight, the generation of cracks in the joint interface can be prevented from occurring even in case the difference in thermal expansion coefficient between the joining materials exceeds $0.5 \times 10^{-6}$/° C.

As described in the foregoing, although depending on the compositional ratio, a glass containing $B_2O_3$ is inferior in resistances against moisture, acids, and alkalis. In the present invention, preferably used as the glass is a silicate glass free of $B_2O_3$. By thus eliminating $B_2O_3$ from the composition, a glass which readily undergoes crystallization and which has high chemical resistance can be obtained. Such a glass increases the reliability of the LC composite component by preventing interlayer migration from occurring in the dielectric layer of the capacitor portion. A crystallized glass exhibits an increased strength, and is therefore advantageous concerning resistance against residual stress which generates at temperatures not higher than the strain point.

Further, as described above, the glass preferably contains, as the principal components thereof, from 1 to 15% by molar of at least one type of a compound expressed by $Ma_2O$ (where Ma represents an alkali metal); from 20 to 70% by molar of at least one type of a compound expressed by MeO (where Me represents an alkaline earth metal); from 5 to 60% by molar of $SiO_2$; and from 0.5 to 70% by molar of $Bi_2O_3$. The component expressed by $Ma_2O$ (where Ma represents an alkali metal) functions as to lower the glass viscosity. If the content of $Ma_2O$ should be lower than 1% by molar, the glass temperature becomes too high as to make sintering at temperatures not higher than 1,000° C. difficult. On the other hand, the content of $Ma_2O$ exceeding 15% by molar reversely decreases the moisture resistance and the Q value of the dielectric.

The component expressed by MeO (where Me represents an alkaline earth metal) accelerates the reaction of a dielectric with a glass. When MeO is present at a content lower than 20% by molar, the reaction with the dielectric does not proceed, and sintering at temperatures not higher than 1,000° C. becomes difficult. Furthermore, the presence of MeO elevates the glass temperature and negatively affects the Q value. The presence of MeO in excess of 70% by molar prevents sintering at 1,000° C. or lower from being achieved, and considerably impairs the Q value.

Glass containing $SiO_2$ in excess of 70% by molar results in too high a glass temperature, such that the glass transition does not occur at temperatures not higher than 1,500° C. If the $SiO_2$ content should be lower than 5% by molar, the resulting sintering exhibits too scattered values in shrinkage ratio as to make the sintering practically unfeasible for use as the base material of the component body 4.

The $Bi_2O_3$ component accelerates the reaction between the glass and the dielectric and the magnetic materials, and lowers the glass viscosity. Sintering at 1,000° C. becomes difficult if the glass contains less than 0.5% by molar of $Bi_2O_3$. A glass containing $Bi_2O_3$ in excess of 70% by molar undergoes reaction with the internal electrode layer, and the resistance thereof against moisture is greatly impaired.

As described above, the glass preferably contains, as the secondary components thereof, 50% by molar or less of $TiO_2$ and 50% by molar or less of CuO; or 5% by molar or less of at least one of the group consisting of ZnO, $Co_3O_4$, and NiO; or 5% by molar or less of at least one of $Al_2O_3$ and $ZrO_2$; or 5% by molar or less of at least one of rare earth oxides; or a combination thereof.

In this case, $TiO_2$ accelerates the reaction of a dielectric with a glass, increases the dielectric constant of the dielectric ceramics, and improves the chemical durability. However, $TiO_2$ present in excess of 50% by molar elevates the melting temperature of the glass to make sintering difficult to occur at temperatures 1,000° C. or lower.

CuO accelerates the reaction of glass with the dielectric and the magnetic material, and also functions as a crystallizing material of the glass. However, CuO incorporated in excess of 50% by molar greatly impairs the Q value.

$Al_2O_3$ and $ZrO_2$ ameliorates the chemical durability of the glass and the component body 4. However, $Al_2O_3$ and $ZrO_2$ that are present in excess of 10% by molar elevates the melting temperature of the glass to make sintering difficult to occur at temperatures 1,000° C. or lower.

ZnO, $Co_3O_4$, and NiO each accelerates the reaction between the glass and the magnetic material as to improve the magnetic properties of the magnetic body. However, ZnO, $Co_3O_4$, or NiO that is present in excess of 5% by molar makes sintering difficult to occur at temperatures 1,000° C. or lower.

The rare earth oxides accelerate the reaction between the glass and the dielectric or the magnetic materials, and increase the dielectric constant. However, a rare earth oxide present in excess of 5% by molar impairs the chemical durability.

The present invention is described in further detail below by making reference to Examples. It should be noted, however, that the present invention is not only limited thereto.

EXAMPLE 1

Barium titanate ($BaTiO_3$) was used as the dielectric ceramic material, and four types of glass as are shown by DG1, DG2, DG3, and DG4 in Table 1 were prepared to add into the $BaTiO_3$ based material. The glass compositions DG1, DG2, and DG3 are those having a composition falling within the range of the present invention, whereas the glass composition DG4 is a comparative example of a borosilicate glass containing alkaline earth metal oxide at an amount falling outside the range claimed in the present invention.

TABLE 1

| Glass for Dielectric Material (composition in unit of mol %) | | | | |
|---|---|---|---|---|
| Glass Type | DG1 | DG2 | DG3 | DG4 |
| Softening point | 520° C. | 640° C. | 780° C. | 850° C. |
| $Li_2O$ | 8.37 | 8.38 | 3.49 | 7.56 |
| BaO | 14.21 | 31.63 | 29.85 | 15.49 |
| CaO | 10.04 | 11.31 | 9.43 | 2.10 |
| MgO | 2.26 | 2.26 | 1.89 | 1.21 |
| $SiO_2$ | 49.74 | 32.41 | 46.16 | 60.20 |
| CuO | — | — | 2.39 | — |
| $TiO_2$ | 7.11 | 6.79 | 3.23 | — |
| $Bi_2O_3$ | 6.97 | 6.02 | 2.36 | — |
| $Al_2O_3$ | 0.80 | 1.00 | 1.20 | — |

TABLE 1-continued

| Glass for Dielectric Material (composition in unit of mol %) | | | | |
|---|---|---|---|---|
| Glass Type | DG1 | DG2 | DG3 | DG4 |
| Softening point | 520° C. | 640° C. | 780° C. | 850° C. |
| $Nd_2O_3$ | 0.50 | 0.20 | — | — |
| $B_2O_3$ | — | — | — | 13.44 |

Nickel—zinc (Ni—Zn) ferrite material was used as a magnetic ceramic material. Four types of glass as are shown by FG1, FG2, FG3, and FG4 in Table 2 were prepared to add into the ferrite material. The glass compositions FG1, FG2, and FG3 are those having a composition falling within the range of the present invention, whereas the glass composition FG4 is a comparative example of a borosilicate glass containing alkaline earth metal oxide at an amount falling outside the range claimed in the present invention.

TABLE 2

| Glass for Magnetic Material (composition in unit of mol %) | | | | |
|---|---|---|---|---|
| Glass Type | FG1 | FG2 | FG3 | FG4 |
| Softening point | 540° C. | 620° C. | 740° C. | 870° C. |
| $Li_2O$ | — | — | — | 7.00 |
| BaO | — | — | — | 15.49 |
| CaO | — | — | — | 2.10 |
| MgO | — | — | — | 1.21 |
| $SiO_2$ | 24.91 | 39.56 | 58.07 | 60.76 |
| CuO | 39.87 | 32.45 | 22.99 | — |
| $Bi_2O_3$ | 29.90 | 22.50 | 13.08 | — |
| ZnO | 4.40 | 4.39 | 4.36 | — |
| $Al_2O_3$ | 0.92 | 1.10 | 1.50 | — |
| $B_2O_3$ | — | — | — | 13.44 |

Each of the glass compositions DG1, DG2, DG3, and DG4 was added into the $BaTiO_3$ dielectric ceramic material at the amount shown in Table 3 below together with a proper quantity of a binder, a plasticizer, and a solvent. The resulting mixtures were each kneaded to prepare the slurries of the dielectric materials. Then, each of the glass compositions FG1, FG2, FG3, and FG4 was added into the Ni—Zn ferrite ceramic material at the amount shown in Table 3 together with a proper quantity of a binder, a plasticizer, and a solvent, and was kneaded to obtain therefrom each of the slurries of the magnetic materials.

The dielectric slurries and the magnetic slurries thus obtained above were each formed into a sheet 100 μm or less in thickness by means of doctor blade process. The resulting ceramic green sheets were each cut into a sheet 12 mm in length and 12 mm in width. Then, by using an Ag/Pd paste, an internal electrode pattern was formed on each of the dielectric green sheets to provide a static capacitance, whereas a coil electrode pattern was formed on each of the magnetic green sheets to establish an inductance.

The dielectric green sheets and the magnetic green sheets were each superposed one after another, and the resulting layered structure was pressed to obtain a final product 3 mm in thickness. Thus was obtained a component body consisting of a capacitor portion and a inductor portion. The thickness of the capacitor portion was the same as that of the inductor portion.

The resulting layered structure was sintered at a temperature in a range of from 900 to 1,000° C. for a duration of 2 hours to obtain the component body. An external electrode was then provided to the end plane of the component body.

The external electrode was provided by applying an electrically conductive paste comprising an Ag powder, glass frit, and an organic vehicle, followed by baking the pattern at 800° C. for a duration of 30 minutes.

Thus was obtained an LC composite component having an appearance as is shown in FIG. 1. The resulting LC composite components were each subjected to evaluation tests concerning sinterability and mechanical properties such as joining properties, $\Delta\alpha$ (=$\alpha_2-\alpha_1$; where $\alpha_1$ represents the thermal expansion coefficient of the dielectric ceramic material, and $\alpha_2$ represents the thermal expansion coefficient of the magnetic ceramic material), and the presence of cracks at the joint interface. The results of the evaluation are shown in Table 3 below.

mechanical properties as in the samples Nos. 2 to 4, 7 to 9, and 12 to 14 above.

By comparing the samples Nos. 1 to 4, 6 to 9, and 11 to 14 with the samples Nos. 5, 10, and 15 to 20, the effect of eliminating $B_2O_3$ from the glass added into the dielectric ceramic material and/or the magnetic ceramic material can be observed. More specifically, the samples Nos. 1 to 4, 6 to 9, and 11 to 14 which use a silicate glass free of $B_2O_3$ exhibit superior sinterability and mechanical properties as compared with the samples Nos. 5, 10, and 15 to 20 which use a glass containing $B_2O_3$. That is, the glass can be more easily crystallized and achieve a higher strength by eliminating $B_2O_3$ from the glass composition. This is advantageous in case residual stress should be considered. Furthermore,

TABLE 3

| Sample No. | Added Glass (1) For Dielectrics | Added Glass (2) For Magnetics | Quantity (wt. %) (1) | Quantity (wt. %) (2) | Sinterability | Joint Properties | $\Delta\alpha$ ($10^{-6}/°$ C.) | Cracks |
|---|---|---|---|---|---|---|---|---|
| 1 | DG1 | — | 18 | 0 | ○ | ○ | 1.0 | No |
| 2 | DG1 | FG1 | 18 | 1 | ○ | ○ | 1.2 | No |
| 3 | DG1 | FG2 | 18 | 1 | ○ | ○ | 1.1 | No |
| 4 | DG1 | FG3 | 18 | 1 | ○ | ○ | 1.3 | No |
| 5 | DG1 | FG4 | 18 | 1 | x | x | 1.3 | No |
| 6 | DG2 | — | 18 | 0 | ○ | ○ | 1.2 | No |
| 7 | DG2 | FG1 | 18 | 1 | ○ | ○ | 1.0 | No |
| 8 | DG2 | FG2 | 18 | 1 | ○ | ○ | 1.4 | No |
| 9 | DG2 | FG3 | 18 | 1 | ○ | ○ | 1.1 | No |
| 10 | DG2 | FG4 | 18 | 1 | x | x | 1.5 | No |
| 11 | DG3 | — | 18 | 0 | ○ | ○ | 1.0 | No |
| 12 | DG3 | FG1 | 18 | 1 | ○ | ○ | 1.3 | No |
| 13 | DG3 | FG2 | 18 | 1 | ○ | ○ | 1.2 | No |
| 14 | DG3 | FG3 | 18 | 1 | ○ | ○ | 1.1 | No |
| 15 | DG3 | FG4 | 18 | 1 | x | x | 1.3 | No |
| 16 | DG4 | — | 18 | 0 | x | x | 1.1 | Yes |
| 17 | DG4 | FG1 | 18 | 1 | x | x | 1.2 | Yes |
| 18 | DG4 | FG2 | 18 | 1 | x | x | 1.2 | Yes |
| 19 | DG4 | FG3 | 18 | 1 | x | x | 1.3 | Yes |
| 20 | DG4 | FG4 | 18 | 1 | x | x | 1.3 | Yes |
| 21 | DG4 | FG1 | 50 | 10 | ○ | ○ | 0.4 | No |
| 22 | DG4 | FG2 | 50 | 10 | ○ | ○ | 0.5 | No |
| 23 | DG4 | FG3 | 50 | 10 | ○ | ○ | 0.5 | No |
| 24 | DG4 | FG4 | 50 | 20 | ○ | ○ | 0.5 | No |

As is shown in Table 3, samples Nos. 5, 10, 15, and 20, which all contain a comparative glass material FG4 added into a magnetic ceramic material, exhibited inferior sinterability. They were not available as normal sinterings at a temperature 1,000° C. or lower. In case of samples Nos. 16 to 20, into which 18 wt. % of a comparative glass DG4 was added, not only a low sinterability was observed, but also cracks generated at the joint interface between the capacitor portion and the inductor portion.

In contrast to above, the samples Nos. 2 to 4, 7 to 9, and 12 to 14 according to the present invention, which comprise one of the glass species DG1, DG2, or DG3 each having a softening point of 800° C. or lower being added at an amount of 18 wt. % or less into the dielectric ceramic material, and one of the glass species FG1, FG2, or FG3 each having a softening point of 800° C. or lower being added at an amount of 18 wt. % or less into the magnetic ceramic material, exhibited favorable sinterability and mechanical properties.

Furthermore, the samples Nos. 1, 6, and 11 according to the present invention, which comprise one of the glass species DG1, DG2, or DG3 each having a softening point of 800° C. or lower being added into the dielectric ceramic material alone, also exhibited favorable sinterability and because the chemical resistance of the glass can be improved, the interlayer migration in the capacitor portion can be prevented from occurring as to further improve the reliability of the LC composite component.

So long as Table 3 is referred, the sinterability and the mechanical properties are favorable for the samples Nos. 21 to 24, in which the comparative glass DG4 is added into the dielectric ceramic material at an amount of 50 wt. % together with 10 wt. % of FG1, FG2, or FG3, or 20 wt. % of FG4. However, when pressure cooker test was performed on these samples Nos. 21 to 24, the insulation resistance thereof was found to decrease from $10^{12}$ to $10^6$ Ω within 10 hours.

In contrast to above, all of the samples Nos. 1 to 4, 6 to 9, and 11 to 14 according to the present invention and subjected to pressure cooker test were found to maintain an insulation resistance of $10^{12}$ Ω even after a duration of 150 hours.

EXAMPLE 2

The same procedure as in Example 1 was followed, except for using an $Al_2O_3$ material for the dielectric ceramic material. The same Ni—Zn ferrite material as that in Example 1 was used for the magnetic ceramic material, while using DG1, DG2, DG3, and DG4 shown in Table 1 as the additive glass materials for the $Al_2O_3$ material and the glass materials FG1, FG2, FG3, and FG4 shown in Table 2 for the Ni—Zn ferrite material.

Each of the glass compositions DG1, DG2, DG3, and DG4 was added into the $Al_2O_3$ dielectric ceramic material at the amount shown in Table 4 below, together with a proper quantity of a binder, a plasticizer, and a solvent. The resulting mixtures were each kneaded to prepare the slurries of the dielectric materials. Then, each of the glass compositions FG1, FG2, FG3, and FG4 was added into the Ni—Zn ferrite ceramic material at the amount shown in Table 4 together with a proper quantity of a binder, a plasticizer, and a solvent, and was kneaded to obtain therefrom each of the slurries of the magnetic materials.

In contrast to above, the samples Nos. 26 to 28, 31 to 33, and 36 to 38 according to the present invention, which comprise one of the glass species DG1, DG2, or DG3 each having a softening point of 800° C. or lower (more specifically, 780° C. or lower) being added into the dielectric ceramic material and one of the glass species FG1, FG2, or FG3 each having a softening point of 800° C. or lower (more specifically, 780° C. or lower) being added into the magnetic ceramic material, exhibited favorable sinterability and mechanical properties.

Furthermore, the samples Nos. 25, 30, and 35 according to the present invention comprise one of the glass species DG1, DG2, or DG3 each having a softening point of 800° C. or lower being added into the dielectric ceramic material alone. These samples also exhibited favorable sinterability

TABLE 4

| Sample No. | Added Glass (1) For Dielectrics | (2) For Magnetics | Quantity (wt. %) (1) | Quantity (wt. %) (2) | Sinterability | Joint Properties | $\Delta \alpha$ ($10^{-6}/°$ C.) | Cracks |
|---|---|---|---|---|---|---|---|---|
| 25 | DG1 | — | 18 | 0 | ○ | ○ | 3.0 | No |
| 26 | DG1 | FG1 | 18 | 1 | ○ | ○ | 3.2 | No |
| 27 | DG1 | FG2 | 18 | 1 | ○ | ○ | 3.1 | No |
| 28 | DG1 | FG3 | 18 | 1 | ○ | ○ | 3.3 | No |
| 29 | DG1 | FG4 | 18 | 1 | x | x | 3.3 | No |
| 30 | DG2 | — | 18 | 0 | ○ | ○ | 3.2 | No |
| 31 | DG2 | FG1 | 18 | 1 | ○ | ○ | 3.1 | No |
| 32 | DG2 | FG2 | 18 | 1 | ○ | ○ | 3.3 | No |
| 33 | DG2 | FG3 | 18 | 1 | ○ | ○ | 3.2 | No |
| 34 | DG2 | FG4 | 18 | 1 | x | x | 3.4 | No |
| 35 | DG3 | — | 18 | 0 | ○ | ○ | 3.1 | No |
| 36 | DG3 | FG1 | 18 | 1 | ○ | ○ | 3.2 | No |
| 37 | DG3 | FG2 | 18 | 1 | ○ | ○ | 3.1 | No |
| 38 | DG3 | FG3 | 18 | 1 | ○ | ○ | 3.2 | No |
| 39 | DG3 | FG4 | 18 | 1 | x | x | 3.3 | No |
| 40 | DG4 | — | 18 | 0 | x | x | 1.0 | Yes |
| 41 | DG4 | FG1 | 18 | 1 | x | x | 1.2 | Yes |
| 42 | DG4 | FG2 | 18 | 1 | x | x | 1.1 | Yes |
| 43 | DG4 | FG3 | 18 | 1 | x | x | 1.3 | Yes |
| 44 | DG4 | FG4 | 18 | 1 | x | x | 1.3 | Yes |

Then, a dielectric green sheet having an internal electrode pattern printed thereon and a magnetic green sheet having a coil electrode pattern printed thereon were each produced by using the thus obtained dielectric slurries and the magnetic slurries and by following a procedure similar to that of Example 1. The resulting green sheets were pressed to obtain a layered structure. The resulting layered structure was sintered at a temperature of 900° C. for a duration of 2 hours to obtain the component body. An external electrode was then provided to the end plane of the component body in the same manner as in Example 1 to obtain an LC composite component having an outer appearance shown in FIG. 1. Then, similar to Example 1, resulting LC composite components were each subjected to evaluation tests concerning sinterability and mechanical properties such as joining properties, $\Delta \alpha$, and the presence of cracks at the joint interface. The results of the evaluation tests are shown in Table 4.

Referring to Table 4, the samples Nos. 29, 34, 39, and 44 prepared by adding a comparative glass FG4 exhibited low sinterability, and would not sinter at 900° C., i.e., at a temperature of 1,000° C. or lower. The same tendency was observed with increasing addition of glass FG4. In samples Nos. 40 to 44, in which comparative glass DG4 is added into the dielectric ceramic material, not only low sinterability was observed, but also cracks were found to generate in the joint interface between the capacitor portion and the inductor portion.

and mechanical properties as in the samples Nos. 26 to 28, 31 to 33 and 36 to 38 above.

Again in Example 2, by comparing the samples Nos. 25 to 28, 30 to 33, and 35 to 38 with the samples Nos. 29, 34, and 39 to 44, it can be seen that the sinterability as well as the mechanical properties ameliorate by eliminating $B_2O_3$ from the glass added into the dielectric ceramic material and/or the magnetic ceramic material. More specifically, similar to Example 1, the glass can be more easily crystallized and can achieve a higher strength by eliminating $B_2O_3$ from the glass composition. This is advantageous in case residual stress should be considered. Furthermore, because the chemical resistance of the glass can be improved, the interlayer migration in the capacitor portion can be prevented from occurring as to further improve the reliability of the LC composite component.

Thus, according to the present invention, it can be seen from the foregoing that, in an LC composite component comprising a component body consisting of a monolithic sintering of a capacitor portion and an inductor portion, excellent joining properties between the capacitor portion and an inductor portion is achieved by adding a glass component added into at least one of the dielectric ceramic layer of the capacitor portion and the magnetic ceramic layer of the inductor portion. Moreover, the glass enables sintering of the dielectric ceramics and the magnetic ceramics at a temperature of 1,000° C. or lower when a glass having a softening point of 800° C. or lower is added into the dielectric body and/or the magnetic body. Thus, even if a difference in thermal expansion should be observed between the capacitor portion and the inductor portion, the residual stress after the sintering can be relaxed.

The present invention allows use of a wider variety of dielectric ceramic materials and magnetic ceramic materials in the combination for monolithic sinterings. Thus, the present invention provides, with further ease, a variety of LC composite components.

While the invention has been described in detail with reference to Examples, it should be understood that various changes and modifications can be made without departing from the scope of the invention.

What is claimed is:

1. A composite component comprising:

a capacitor including a dielectric ceramic layer and a pair of electrode layers;

an inductor including a magnetic ceramic layer and an electrode layer, said inductor being in contact with said capacitor;

wherein at least one of said dielectric ceramic layer and said magnetic layer contains a glass having a softening point of 800° C. or lower, wherein the glass contains, as the principal component thereof, from 1 to 15% by molar of at least one type of a compound expressed by $Ma_2O$, where Ma represents an alkali metal;

from 5 to 60% by molar of $SiO_2$; and from 0.5 to 70% by molar of $Bi_2O_3$.

2. A composite component according to claim 1, wherein the glass is contained in at least one of said dielectric ceramic layer and said magnetic layer at a concentration of from 0.5 to 90% by weight.

3. A composite component according to claim 1, wherein the glass is a silicate glass free of $B_2O_3$.

4. A composite component according to claim 1, wherein said glass contains a positive amount of at least one rare earth oxide as a secondary component and in an amount of 5 molar % or less.

5. A composite component according to claim 1, wherein the glass contains 50% by molar or less of $TiO_2$ and 50% by molar or less of CuO as a secondary components.

6. A composite component according to claim 1, wherein the glass contains 5% by molar or less of at least one of the group consisting of ZnO, $Co_3O_4$, and NiO as a secondary component.

7. A composite component according to claim 1, wherein the glass contains 5% by molar or less of at least one of $Al_2O_3$ and $ZrO_2$ as a secondary component.

8. A composite component according to claim 1, in which said magnetic layer contains glass.

9. A composite component comprising:

a capacitor including a dielectric ceramic layer and a pair of electrode layers;

an inductor including a magnetic ceramic layer and an electrode layer, said inductor being in contact with said capacitor;

wherein at least one of said dielectric ceramic layer and said magnetic layer contains a glass having a softening point of 800° C. or lower and wherein the glass contains $TiO_2$ and CuO as secondary components, each of which is in an amount of 50 molar % or less.

10. A composite component comprising:

a capacitor including a dielectric ceramic layer and a pair of electrode layers;

an inductor including a magnetic ceramic layer and an electrode layer, said inductor being in contact with said capacitor;

wherein at least one of said dielectric ceramic layer and said magnetic layer contains a glass having a softening point of 800° C. or lower and wherein the glass contains at least one of $Al_2O_3$ and $ZrO_2$ as a secondary component and in an amount of 5 molar % or less.

11. A composite component comprising:

a capacitor including a dielectric ceramic layer and a pair of electrode layers;

an inductor including a magnetic ceramic layer and an electrode layer, said inductor being in contact with said capacitor;

wherein at least one of said dielectric ceramic layer and said magnetic layer contains a glass having a softening point of 800° C. Or lower and wherein the glass contains at least one of ZnO, $Co_3O_4$ and NiO as a secondary component and in an amount of 5 molar % or less.

* * * * *